(12) United States Patent
Enne et al.

(10) Patent No.: US 12,712,538 B2
(45) Date of Patent: Aug. 18, 2026

(54) DIGITAL SIGNAL FILTERING SYSTEM AND METHOD OF APPLICATION

(71) Applicant: Avago Technologies International Sales Pte. Limited, Singapore (SG)

(72) Inventors: Reinhard Enne, Hofstetten-Gruenau (AT); Wolfgang Gaberl, Vienna (AT); Milos Davidovic, Vienna (AT)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 18/784,576

(22) Filed: Jul. 25, 2024

(65) Prior Publication Data

US 2026/0031802 A1 Jan. 29, 2026

(51) Int. Cl.
*H03K 5/125* (2006.01)
*H03L 7/089* (2006.01)

(52) U.S. Cl.
CPC ............. *H03K 5/125* (2013.01); *H03L 7/089* (2013.01)

(58) Field of Classification Search
CPC ................................ H03K 5/125; H03L 7/089
See application file for complete search history.

(56) References Cited

U.S. PATENT DOCUMENTS 5,349,193 A 9/1994 Mott et al.
7,352,167 B2 * 4/2008 Sullivan ............. G01R 13/0254 702/68
2023/0417932 A1 12/2023 Michel et al.

FOREIGN PATENT DOCUMENTS

GB 2493397 A * 2/2013 ............. H03K 5/125
WO 2008146218 A2 12/2008

OTHER PUBLICATIONS

Siu, C. et al., Chapter 14—Application Specific Integrated Circuits (ASICs) for Spectral Photon Counting, In Spectral, Photon Counting Computed Tomography, CRC Press, 2020, pp. 251-277.
Extended European Search Report for Application No. EP 25191325.7 dated Dec. 5, 2025; 10 pages.
Lee, Daehee et al., "Energy-correction photon counting pixel for photon energy extraction under pulse pile-up", Nuclear Instruments and Methods in Physics Research A, Accepted Feb. 27, 2017, Available online Feb. 28, 2017, 0168-9002 / © 2017 Elsevier B.V., pp. 36-46.

(Continued)

*Primary Examiner* — Sibin Chen
*Assistant Examiner* — James G Yeaman
(74) *Attorney, Agent, or Firm* — Quarles & Brady LLP

(57) ABSTRACT

A system for enhancing digital signal event counting is provided. The system includes a pulse filter coupled between a plurality of comparators and a plurality of counters. The pulse filter is configured to generate a refined signal associated with a rising edge and a falling edge of each comparator output corresponding to a threshold level. The pulse filter identifies the timing characterization of at least two refined signals respectively corresponding to a lower threshold level and a next higher threshold level and generates a trigger signal corresponding to an event counting based on the timing characterization associated with both the rising edge and the falling edge. Corresponding counters increment a count at the lower threshold level or both the lower threshold level and the next higher threshold level for each event counting based on the trigger signal.

15 Claims, 9 Drawing Sheets

(56) References Cited

OTHER PUBLICATIONS

Prekas, G. et al., "Direct and Indirect Detectors for X-Ray Photon Counting Systems", 2011 IEEE Nuclear Science Symposium Conference Record, 4 pages.

De Geronimo, Gianluigi et al., "ASIC With Multiple Energy Discrimination for High-Rate Photon Counting Applications", IEEE Transactions on Nuclear Science, vol. 54, No. 2, Apr. 2007, pp. 303-312.

* cited by examiner

442
INVD
INVD
611
612
613
614
615
616
617
618
619
short trigger
nominal trigger
long trigger
nom.rise
nom.decay
del.decay
extd.del.decay
del.rise
t

DIGITAL SIGNAL FILTERING SYSTEM AND METHOD OF APPLICATION

FIELD OF INVENTION

The subject technology is directed to digital signal processing and method of application.

BACKGROUND OF THE INVENTION

In advanced Photon Counting Computed Tomography (PCCT) systems, radiation detectors send signals to a front-end amplifier, such as a Charge Sensing Amplifier (CSA) or Trans-Impedance Amplifier (TIA). These amplified signals are then measured against multiple thresholds using several comparators, and the outputs are counted each time they cross these thresholds. To calculate the number of events within a specific energy range, defined by consecutive threshold levels, the difference between the counts of two successive thresholds is taken.

However, challenges arise when multiple photons hit the detector in quick succession. If photons arrive within a time shorter than about 50 ns, the amplifier may not have enough time to respond adequately, leading to potential miscounts. This quick succession can cause missed counts if photon energies span different thresholds or incorrect counts if photons of similar energies arrive close together. These issues can adversely affect the accuracy of the energy spectrum analysis, limiting the overall effectiveness of the PCCT system. Therefore, a digital pulse filtering system is needed to enhance the performance of the various radiation sensing/event counting systems in a wide range of applications including the PCCT system.

BRIEF DESCRIPTION OF THE DRAWINGS

A further understanding of the nature and advantages of particular embodiments may be realized by reference to the remaining portions of the specification and the drawings, in which reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

The subject technology provides a system for enhancing digital signal event counting. The system includes a pulse filter coupled between a plurality of comparators and a plurality of counters. The pulse filter is configured to generate a refined signal associated with a rising edge and a falling edge of each comparator output corresponding to a threshold level. The pulse filter identifies the timing characterization of at least two refined signals respectively corresponding to a lower threshold level and a next higher threshold level and generates a trigger signal corresponding to an event counting based on the timing characterization associated with both the rising edge and the falling edge. Corresponding counters increment a count at the lower threshold level or both the lower threshold level and the next higher threshold level for each event counting based on the trigger signal. There are other embodiments as well.

Figure 1:
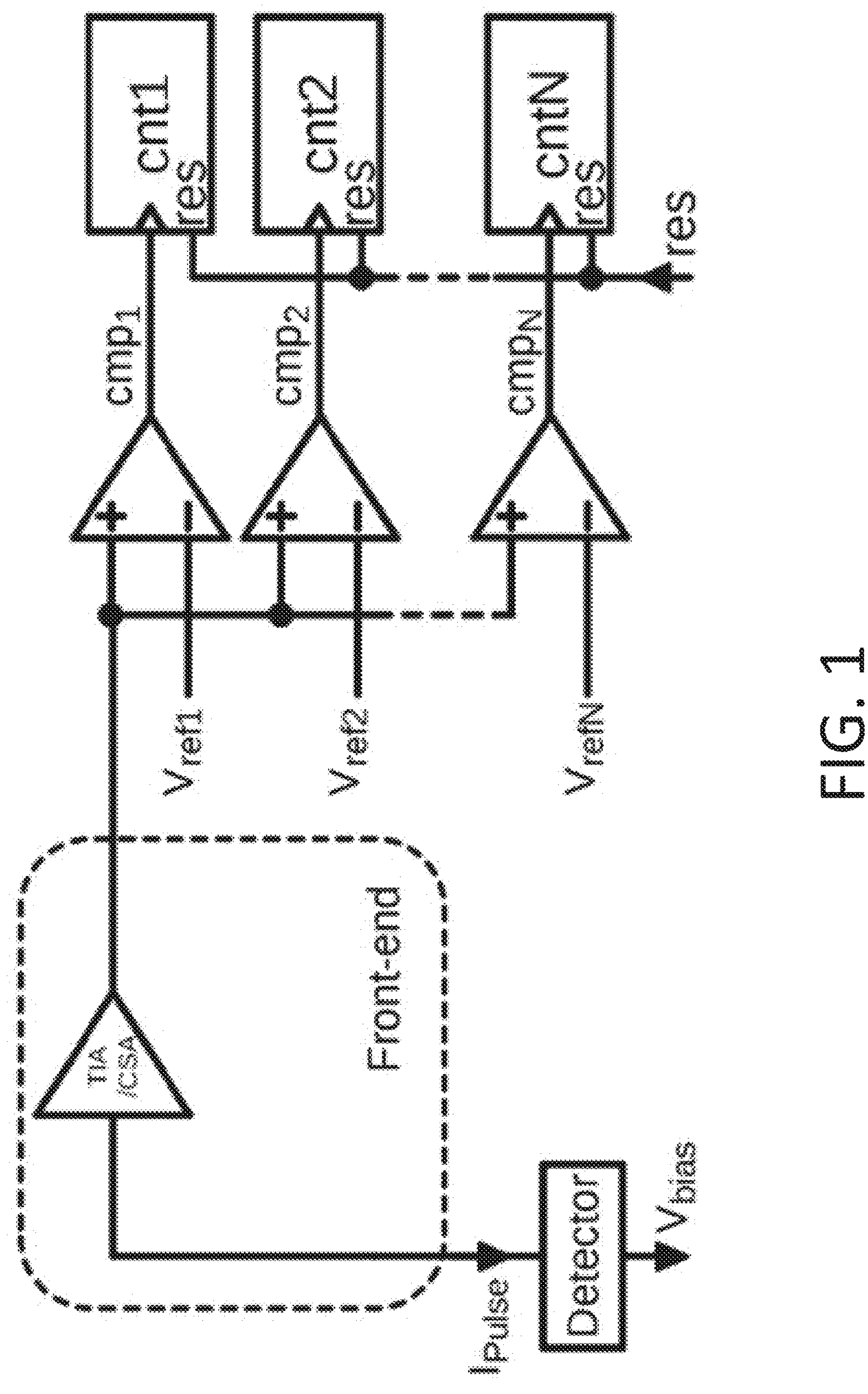
FIG. 1 is a block diagram of a sensing front-end coupled with digital comparators and counters.
Figure 2:
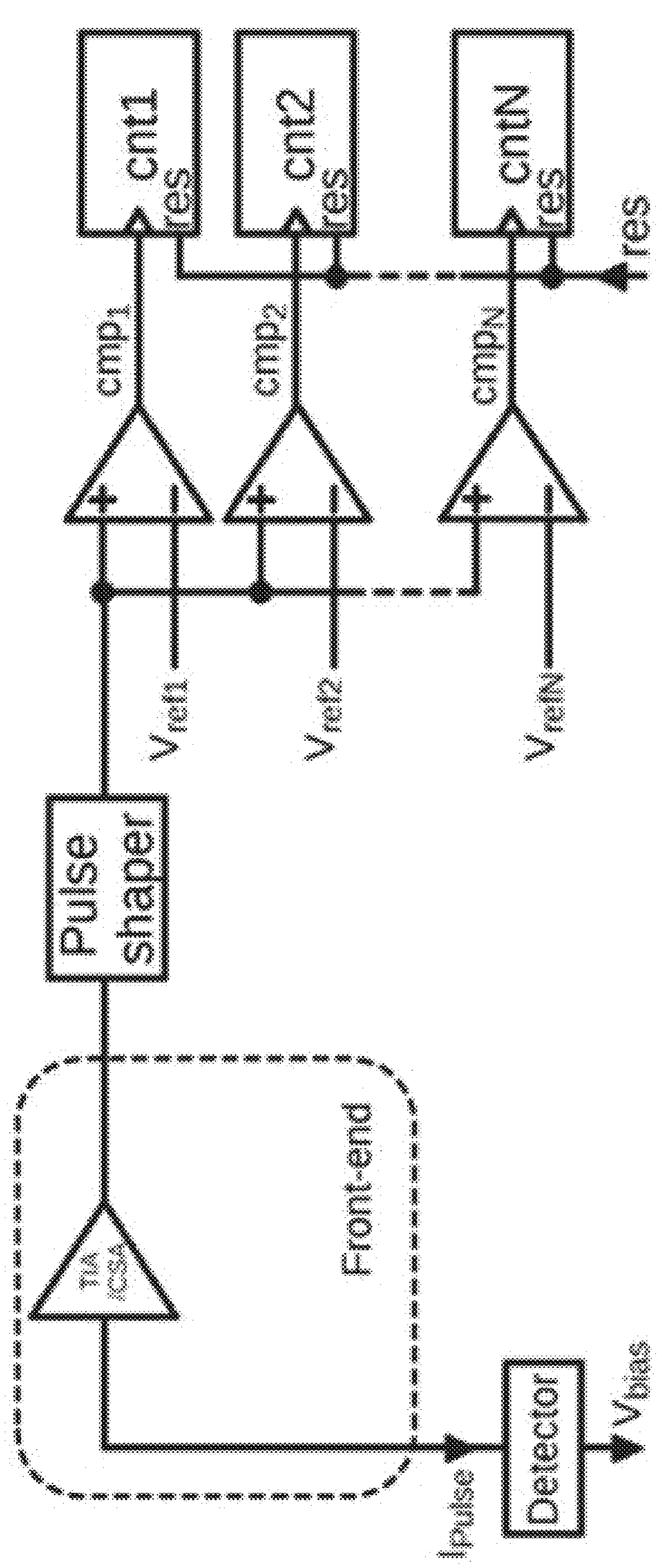
FIG. 2 is a block diagram of a sensing front-end coupled with a pulse shaper in front of digital comparators and counters.

FIG. 1 shows an example of a front-end system architecture for the photon-counting CT scanner. The circuit starts with a detector that converts incoming photons into electrical current pulses ($I_{pulse}$). A bias voltage ($V_{bias}$) is applied to the detector for proper operation. These current pulses are fed into a front-end amplifier, which can be a TIA or a CSA. The amplifier converts the current pulses into voltage pulses that are proportional to the energy of the incoming photons. The amplified voltage pulses are then compared against a series of reference voltage thresholds ($V_{ref1,ref2}, \ldots, V_{refN}$) using multiple comparators ($cmp_1, cmp_2, \ldots, cmp_N$). Each comparator output is connected to a corresponding counter ($cnt_1, cnt_2, \ldots, cnt_N$) which counts the number of pulses that exceed its respective threshold voltage. The count value of each counter indicates the number of photons that have energies greater than the comparator threshold. The counts for each energy bin (or "energy bar") are calculated by subtracting the previous counter value from the current counter value, providing energy discrimination of the incoming photons. The circuit also includes a reset signal (res) that clears the counters, ensuring that the counting starts fresh for each scanning interval. FIG. 2 is a front-end system architecture employing a pulse shaping post-amplification to convert step-like pulses into voltage pulses with specified height and duration, often having transfer functions with bandpass-like characteristics on the signal. This shaping process takes place in the analog domain before the signal reaches the comparators.

To determine the number of events corresponding to a certain range of amplitudes, whereby the range is defined by the threshold values $V_{refN-1}$ and $V_{refN}$, one can calculate this by subtracting the counter state N−1 from the counter state N. This approach functions effectively when photons arrive at a slow speed, ensuring sufficient temporal separation between two consecutive photons. Ideally, the partial order of the threshold values from level A to level B is reflected in the number of counts in corresponding counter A and counter B: $V_{refA} \leq V_{refB} \rightarrow N_{cntA} \geq N_{cntB}$. As long this is true (for low count rates) the energy bin can be calculated by subtracting adjacent counter values: $BIN_{EA,EB} = N_{cntA} - N_{cntB}$.

Figure 3:
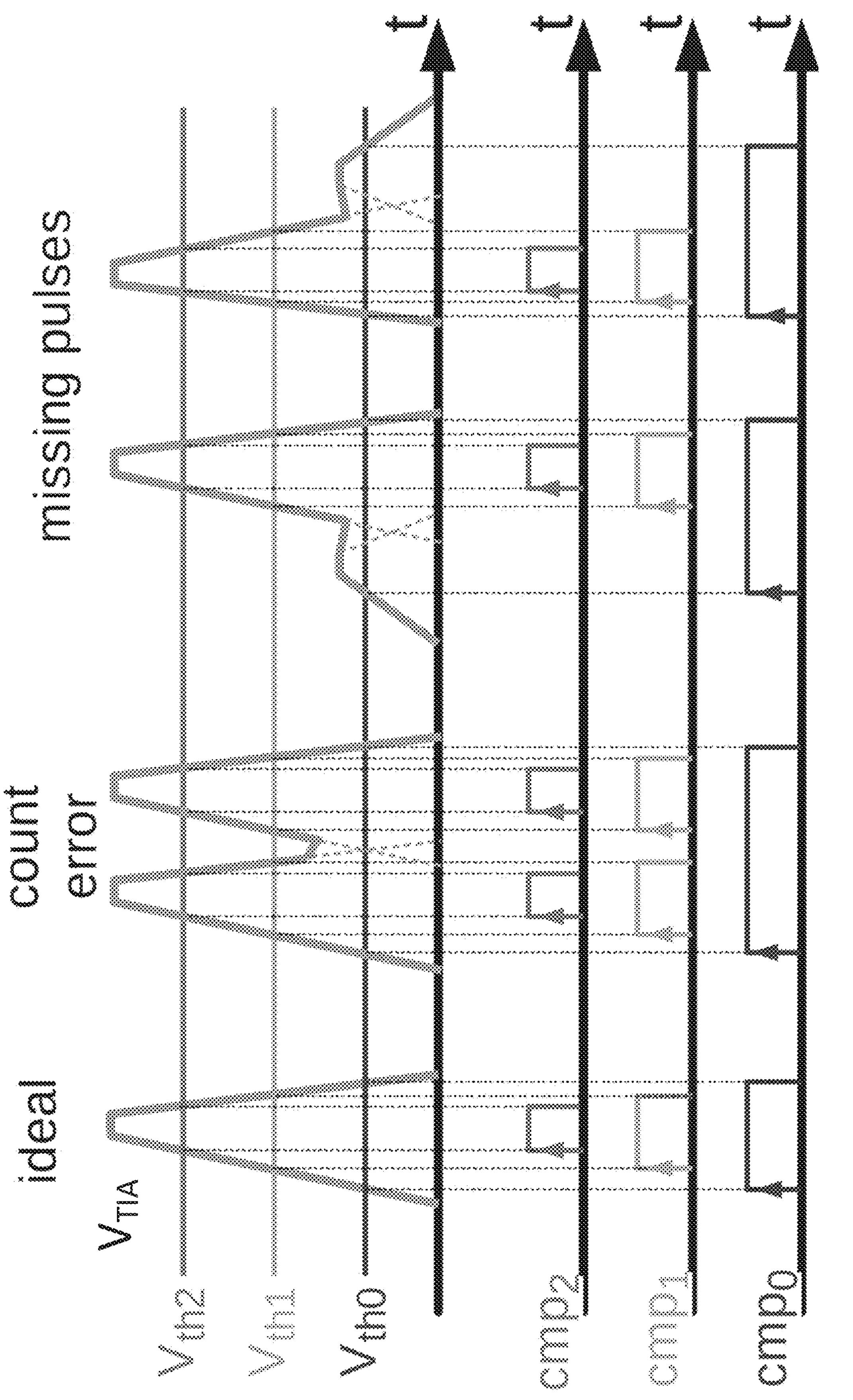
FIG. 3 is a plot of several optional signal events in the time domain based on detection using a sensing front-end (FIG. 1).

The challenge arises when two or more photons arrive in close temporal proximity, as illustrated in FIG. 3 with different signal pulse (event) shapes and heights relative to multiple threshold levels and corresponding comparator outputs. "Close temporal proximity" here denotes any duration near the photon detection bandwidth time constant. For instance, in a typical photon counting CT sensing front-end, detecting two photons arriving closer than 50 ns presents a challenge. This period represents a typical value and can be shorter or longer as well. If two pulses are too close in time the pulses of the TIA front-end do not have time to go back to the baseline. In this case, lower threshold values no longer crossed both pulses, causing the violation of the above threshold-count relationship, and the energy binning by subtracting counter values no longer works, resulting in the counting error. In another case, if pulses with different heights are close in time the lower pulse count event might be suppressed. Even though the threshold-count relationship is not violated, the low-energy pulses are just not counted. In this case, disregarding whether the higher energy pulse is occurring ahead or after a weak pulse, the weaker pulse will be missed, and the system may encounter missed events.

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the present invention is not intended to be limited to the embodiments presented but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent, or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Moreover, the terms left, right, front, back, top, bottom, forward, reverse, clockwise, and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and the use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require the selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect of the subject technology includes a system for enhancing digital signal event counting. The system also includes a front-end amplifier configured to convert current/charge signals collected by a photon detector to voltage signals. The system also includes a plurality of comparators, each being associated with a threshold level, coupled to the front-end amplifier to compare the voltage signals against each threshold level to generate the plurality of comparator outputs at corresponding threshold levels for each voltage signal. The system also includes a pulse filter coupled to the plurality of comparators and configured to generate a refined signal associated with a rising edge and a falling edge of each comparator output, identify timing characterization of at least two refined signals respectively corresponding to a lower threshold level and a next higher threshold level, and generate a trigger signal corresponding to an event counting based on the timing characterization associated with both the rising edge and the falling edge. The system also includes a plurality of counters coupled to the pulse filter and configured to increment a count at the lower threshold level or both the lower threshold level and the next higher threshold level for each event counting based on the trigger signal.

Implementations of the system may include one or more of the following features. The pulse filter may include a plurality of filter units coupled to the plurality of comparators in a cascaded configuration with each filter unit receiving the comparator output from one of the plurality of comparators at a corresponding threshold level. The pulse filter in the cascaded configuration is configured to generate a trigger signal at a highest threshold level crossing the voltage signal for the counters corresponding to the threshold level based on a single pulse for each event. Each filter unit may include a first-stage circuit coupled with a second-stage circuit, the first-stage circuit configured to process the comparator output to obtain a refined signal and a rising-edge signal and a falling-edge signal to respectively detect the rising edge and the falling edge for differentiating the refined signal. The second stage circuit is configured to cross-couple with the first stage circuit coupled to a comparator at the lower threshold level and another first stage circuit coupled to a comparator at the next higher threshold level. The second stage circuit may include a first-branch inverting delay sub-circuit to introduce a first delay to the falling edge of one of two refined signals corresponding to either the lower threshold level or the next higher threshold level to generate a hold signal for discriminating the refined signal corresponding to the lower threshold level with a duration shorter than the first delay if no refined signal corresponding to the higher threshold level is detected within the first delay. The second stage circuit further may include a feedback sub-circuit configured to process the hold signal to generate a trigger signal by differentiating a rising edge of the hold signal corresponding to the lower threshold level. The second stage circuit further may include a second-branch inverting delay sub-circuit to introduce a second delay to the falling edge of either the trigger signal from the feedback sub-circuit or the refined signal corresponding to the falling edge signal at the next higher threshold level to generate a block signal for a timespan of the second delay. The second stage circuit further is configured to combine the block signal and the falling edge signal at the lower threshold level to discriminate the refined signal corresponding to the lower threshold level with its falling edge within the timespan of the second delay, provided that either the trigger signal from the feedback sub-circuit or the falling edge signal at the next higher threshold level occurs.

In some embodiments, the pulse filter is configured to measure the timespan between crossing the lower threshold level and the next higher threshold level in both ascending and descending directions and generate the trigger signal to cause a multi-event count increment of both counters corresponding to the lower threshold level and the next higher threshold level if the timespan exceeds the first delay. The counter corresponding to the lower threshold level is configured to increment its state triggered by the rising edge of the comparator output corresponding to the lower threshold level and the comparator output staying high for a timespan after the rising edge, provided there is no rising edge at the comparator output corresponding to the next higher threshold level within the timespan of the sum of the first delay and the second delay. The counter corresponding to the lower threshold level is configured to increment its state on the falling edge of the comparator output corresponding to the lower threshold level if there is no falling edge at the comparator output corresponding to the next higher threshold level and the rising edge of the comparator output corresponding to the lower threshold level occurred beyond a timespan of the sum of the first delay and the second delay. The counter corresponding to the lower threshold level is configured to increment its state on the rising edge of the comparator output corresponding to the lower threshold level if a rising edge of the comparator output corresponding to the next higher threshold level occurred beyond a timespan of the first delay starting after the rising edge of the comparator output corresponding to the lower threshold level. The counter corresponding to the lower threshold level is configured to increment its state if the comparator output corresponding to the next higher threshold level exhibits a falling edge and no falling edge of comparator output corresponding to the lower threshold level occurs within a timespan of the first delay after the falling edge of the comparator output corresponding to the next higher threshold level. The counter corresponding to the lower threshold level is configured to increment its state at the falling edge of the comparator output corresponding to the lower threshold level if the comparator output stays high at least for a minimum period defining an event.

Another general aspect of the subject technology includes a system for enhancing digital signal event counting. The system also includes a trans-impedance amplifier configured to convert current signals collected by a photon detector to voltage signals. The system also includes a pulse shaper configured to convert the voltage signals with specified time durations and amplitudes. The system also includes a plurality of comparators coupled to the pulse shaper to compare the voltage signals against respective the plurality of threshold levels to generate a comparator output at each threshold level for each voltage signal. The system also includes a pulse filter coupled to the plurality of comparators and configured to generate a trigger signal corresponding to an event counting by distinguishing and reconstructing the comparator outputs in both the time duration and amplitude domains. The system also includes a plurality of counters coupled to the pulse filter and configured to increment a count for each corresponding counter at two adjacent threshold levels based on the trigger signals by considering both ascending and descending of a single pulse for each event.

Implementations may include one or more of the following features. The pulse filter may include a plurality of filter units coupled to the plurality of comparators in a cascaded configuration with each filter unit receiving the comparator output from one of the plurality of comparators at a corresponding threshold level. Each filter unit may include a first-stage circuit coupled with a second-stage circuit, the first-stage circuit being configured to process the comparator output to obtain a refined signal and to detect the rising edge and the falling edge for differentiating the refined signal. The second stage circuit is configured to cross-couple with the first stage circuit coupled to a comparator at a lower threshold level and another first stage circuit coupled to a comparator at a next higher threshold level. The second stage circuit may include at least two inverting delay sub-circuits, a couple of logic sub-circuits, and a feedback sub-circuit, where the inverting delay sub-circuit may include a current source regulated by a bias voltage to provide an adjustable time delay implemented in the pulse filter.

Figure 4:
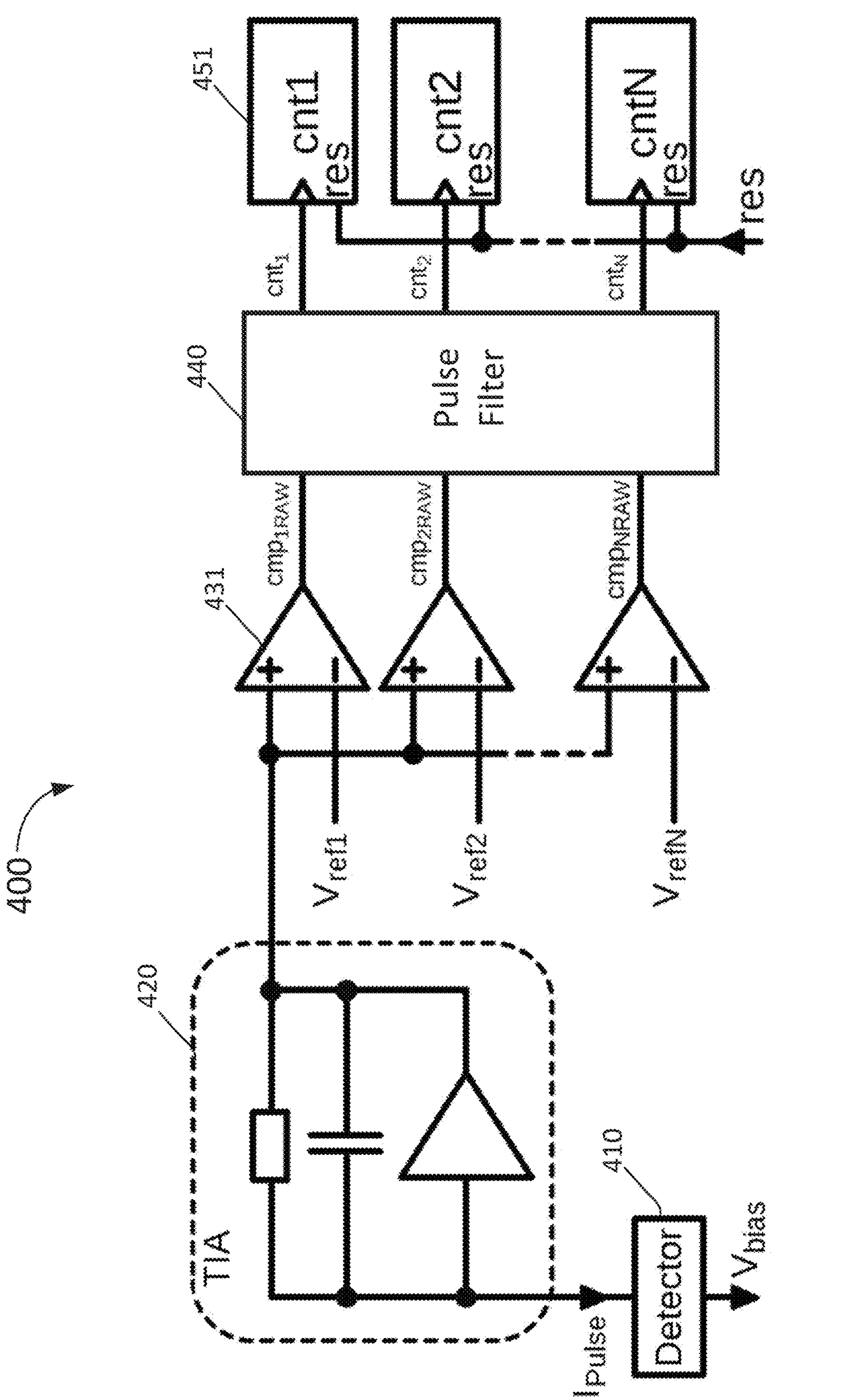
FIG. 4 is a circuit diagram of a sensing front-end coupled with digital comparators and a pulse filter in front of counters according to an embodiment of the subject technology.

FIG. 4 is a block diagram of a sensing front-end coupled with digital comparators and a pulse filter in front of counters according to an embodiment of the subject technology. This diagram is merely an example and should not unduly limit the scope of the claims. One of ordinary skill in the art would recognize many variations, alternatives, and modifications. In an embodiment, FIG. 4 illustrates a system 400 developed based on a front-end architecture for the PCCT system in FIG. 1 by integrating a pulse filter 440 between multiple comparators 431 and counters 451 at corresponding threshold levels to enhance photon counting accuracy. The TIA 420 receives the current pulses from the detector 410 and converts them into voltage signals. It is designed to amplify the signals generated by the detector 410, making them strong enough for further processing. Following amplification, the output from TIA 420 is fed into several comparators. Each comparator 431 is set to a specific reference voltage threshold level ($V_{ref1,ref2}, \ldots, V_{refN}$), corresponding to different energy levels of photons. Each of the comparators 431 generates a digital output signal, comparator output ($cmp_{1raw}, cmp_{2raw}, \ldots, cmp_{Nraw}$), whenever the input voltage signal exceeds their respective threshold levels. These outputs are raw and may include noise and errors due to the quick succession of photon events or overlapping signal amplitudes.

In an embodiment, the pulse filter 440 introduced by the subject technology is to address the issue of rapid photon event overlap at high photon flux (e.g., two photons arriving closer than 50 ns) by processing the comparator outputs ($cmp_{1raw}, cmp_{2raw}, \ldots, cmp_{Nraw}$) from the comparators 431. The pulse filter 440 serves to clean up the signals by correcting for errors such as missing pulses or false counts to generate filtered outputs ($cnt_1, cnt_2, \ldots, cnt_N$). The filtered comparator outputs are connected to counters 451. Each counter 451 increments its count when a pulse that exceeds the corresponding threshold level is detected. The count in each counter 451 represents the number of detected photons that have an energy above the specific threshold level set for comparator 431. To calculate the counts in a specific energy range (or "energy bar"), the difference between adjacent counters is taken. For example, the counts for energy bar N are calculated as Energy Bar $Count_N = cnt_N - cnt_{N-1}$. This value represents the number of photons that have energies falling between the threshold levels of $cmp_{N-1}$ and $cmp_N$. This system 400 is specifically designed to mitigate both count errors and missing pulse events that are demonstrated in FIG. 3. This covers situations where either two or more events of similar amplitude happen so close together that they merge into one indiscernible event, or when events with different amplitudes that should fall into separate energy bars occur almost simultaneously, complicating or even preventing accurate counting with some techniques.

In a specific embodiment, the pulse filter 440 is configured to generate a refined signal associated with a rising edge and a falling edge of each comparator output, identify timing characterization of at least two refined signals respectively corresponding to a lower threshold level (e.g., $V_{refN}$) and a next higher threshold level (e.g., $V_{refN+1}$), and generate a trigger signal corresponding to an event counting based on the timing characterization associated with both the rising edge and the falling edge. This corrects for any discrepancies in the pulse counts caused by rapid successive photon hits. The clean outputs from the pulse filter 440 ensure that each counter 451 tallies only the correct events, providing a precise count of photons per energy range. In an embodiment, the counters 451 coupled to the pulse filter 431 are configured to increment a count at the lower threshold level (e.g., $V_{refN}$) or both the lower threshold level and the next higher threshold level (e.g., $V_{refN+1}$) for each event counting based on the trigger signal.

Figure 5:
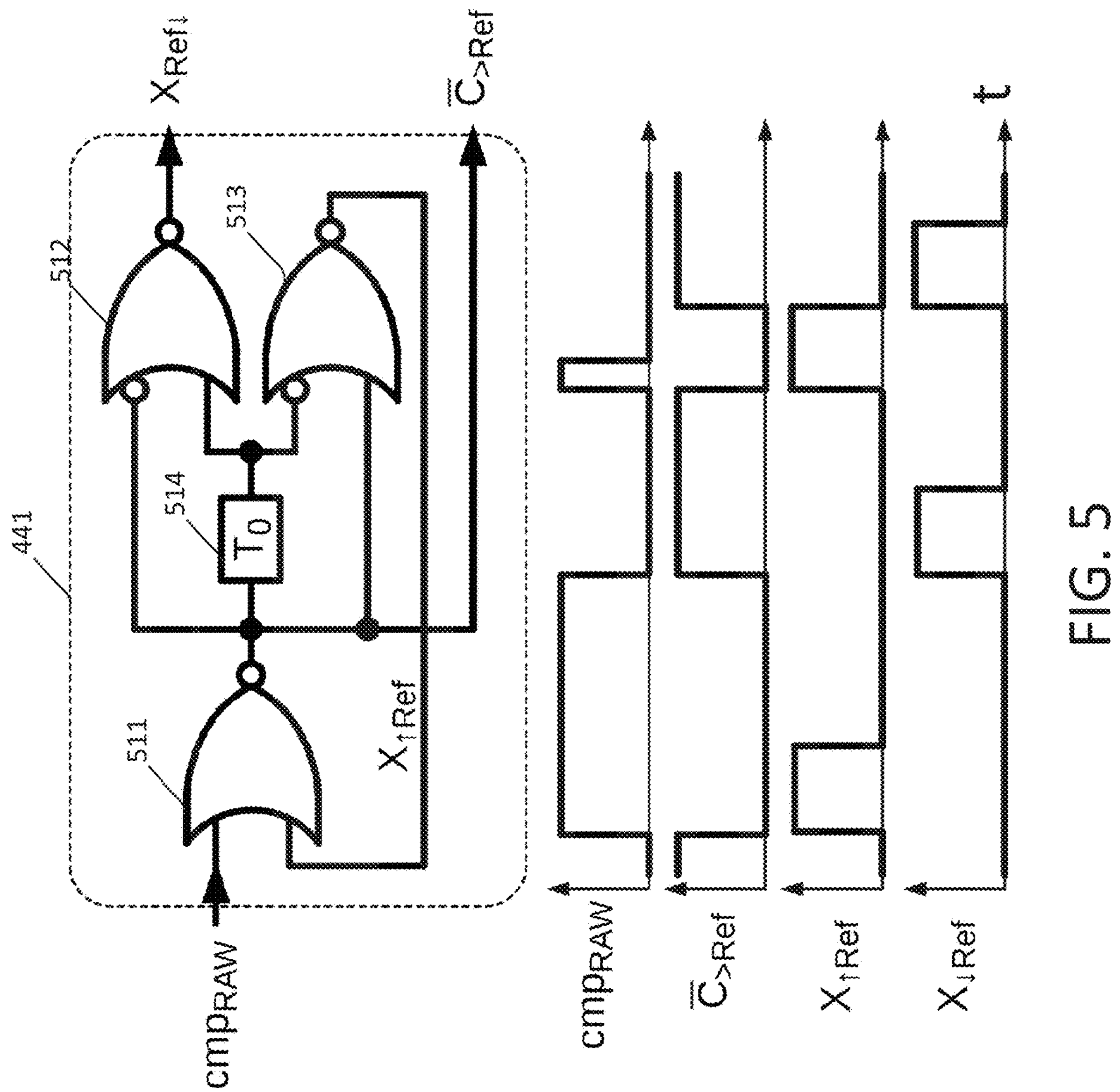
FIG. 5 is a circuit diagram of a first stage of the pulse filter operating at one threshold level and a corresponding signal timing diagram according to an embodiment of the subject technology.

FIG. 5 is a circuit diagram of a first-stage circuit of the pulse filter operating at one threshold level and a corresponding signal timing diagram according to an embodiment of the subject technology. This diagram is merely an example and should not unduly limit the scope of the claims. One of ordinary skill in the art would recognize many variations, alternatives, and modifications. In an embodiment, the pulse filter 440 of FIG. 4 comprises a plurality of filter units coupled to the multiple comparators in a cascaded configuration with each filter unit receiving the comparator output from one comparator at a corresponding threshold level. This circuit 441 in FIG. 5 is an input stage of just one filter unit corresponding to one threshold level. for shaping the incoming raw comparator output $cmp_{RAW}$ to produce a cleaner and more reliable signal for downstream processing and counting. Circuit 441, an example, includes three NOR gates, 511, 512, and 513, and a delay block 514 for shaping the incoming raw comparator output $cmp_{RAW}$ to produce a cleaner and more reliable signal for downstream processing and counting. In this scheme, the first NOR gate 511 is coupled to the comparator output $cmp_{RAW}$ as an initial input of the input stage circuit 441. These cmp signals switch from low to high when the input pulse exceeds a predetermined threshold voltage. NOR gate 511 is intricately linked in a feedback loop over a $T_0$ delay circuit 514, and the bottom NOR gate 513 features one inverted input. Circuit 441 as shown in FIG. 5 is merely an example and does not set a limitation of its circuitry structure. A person skilled in the art could use other logic gates such as NAND circuits to achieve the same or similar functions provided in circuit 441.

In an embodiment, this circuit 441 detects a rising edge when $cmp_{RAW}$ transitions from low to high. Through the use of logic gates and the delay, circuit 441 generates a rising edge signal $X_{\uparrow Ref}$. Similarly, falling edges (indicated by falling edge signal $X_{\downarrow ref}$) are detected when $cmp_{RAW}$ goes from high to low. Circuit 441 ensures that this transition is smoothed out and debounced to avoid misinterpretation of noise as a falling edge. The circuitry arrangement of the input stage filter unit ensures that the output $X_{\uparrow ref}$ functions as a positive differentiator with a time constant $T_0$. Similarly, the output $X_{\downarrow ref}$ serves as the differentiator of the refined signal $\overline{C}_{>Ref}$. Combining the results of rising and falling edge detections, circuit 441 outputs a clean pulse signal, $\overline{C}_{>Ref}$, i.e., an inverted input with a minimum active signal length of $T_0$. It is a refined comparator output used for accurate counting and further processing. The two refined signals $\overline{C}_{>Ref}$ and $X_{\downarrow ref}$ are then directed to the subsequent stage of the pulse filter 440.

Figure 6:
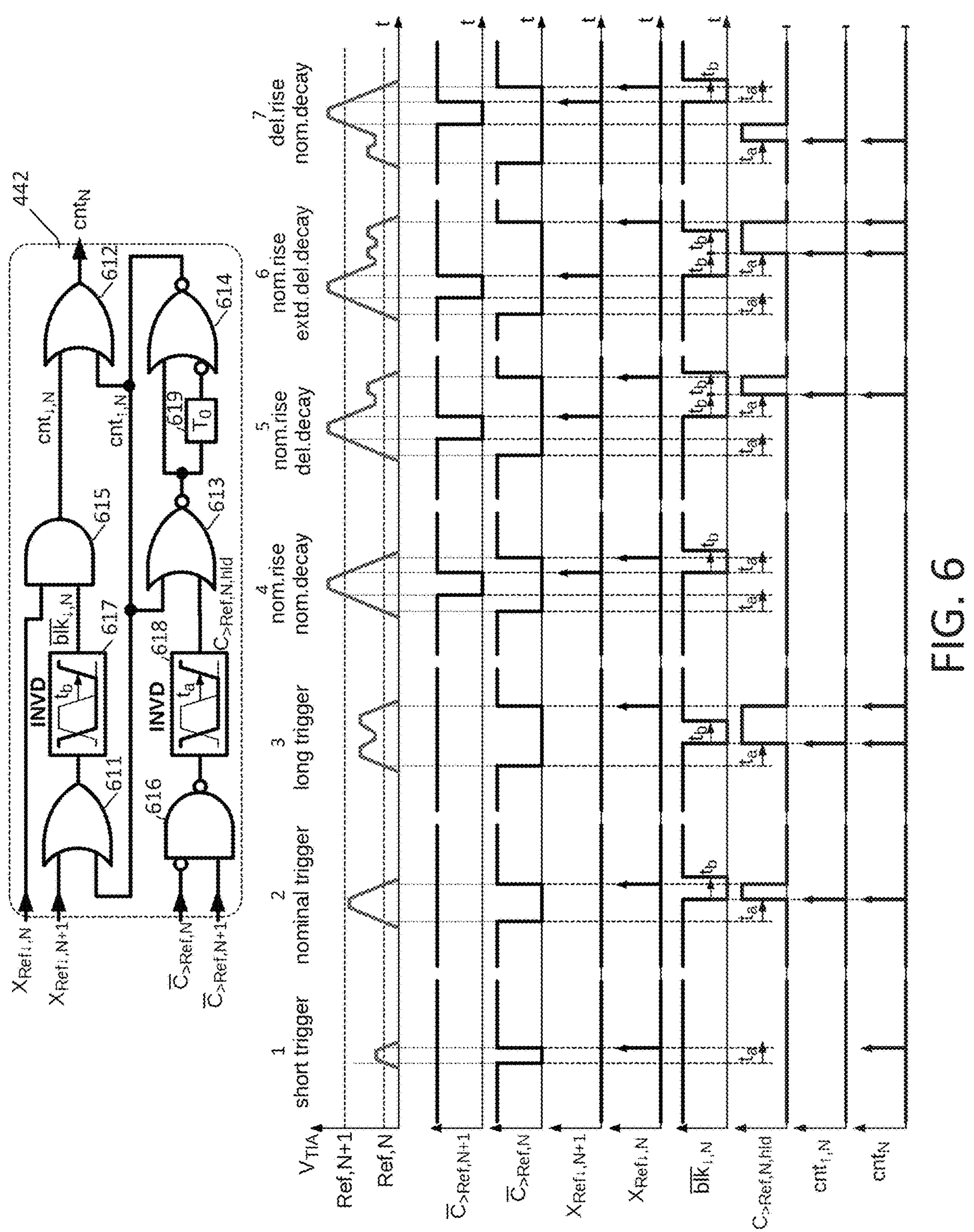
FIG. 6 is a circuit diagram of a second stage of the pulse filter operating at two threshold levels and a corresponding signal timing diagram according to an embodiment of the subject technology.

FIG. 6 is a circuit diagram of a second-stage circuit of the pulse filter operating at two threshold levels and a corresponding signal timing diagram according to an embodiment of the subject technology. This diagram is merely an example and should not unduly limit the scope of the claims. One of ordinary skill in the art would recognize many variations, alternatives, and modifications. In an embodiment, the second stage circuit 442 of pulse filter 440 of FIG. 4 is configured to cross-couple with the first stage circuit 441 coupled to a comparator at the lower threshold level (e.g., level N) and another first stage circuit 441 coupled to a comparator at the next higher threshold level (e.g., level N+1). The second stage circuit 442 uses comparator outputs corresponding to adjacent threshold levels to rectify missing pulse errors by refining the signals with consideration of both the rising edge and falling edge and the time duration between them. Circuit 442 as shown in FIG. 6 is merely an example and does not set a limitation of its circuitry structure. A person skilled in the art could use other logic gate circuits to achieve the same or similar functions provided in circuit 442.

Referring to FIG. 6, circuit 442 embodies a single-level filter stage, signifying the subsequent stage in the filtering process of pulse filter 440 (FIG. 4). A lower branch of circuit 442 includes a NAND gate 616 coupled to an inverting delay (INVD) circuit block 618, which functions as an inverting gate and introduces a first delay for each falling input edge over a predetermined period $t_a$. The output of INVD circuit 618, labeled as the refined signal $C_{>Ref,N,hld}$, discriminates against all refined signals $\overline{C}_{>Ref,N}$ from the first stage circuit 441, corresponding to a threshold level N, provided no active refined signal $\overline{C}_{>Ref,N+1}$ from the first stage circuit 441 corresponding to a higher threshold level N+1 is present, extended by the time constant $t_a$. This refined signal $C_{>Ref,N,hld}$ integrates into a feedback circuit comprising two NOR circuits 613 and 614, and a $T_0$ delay block 619.

The purpose of this feedback circuit is to generate the signal $cnt_{\uparrow,N}$, acting as a differentiator for the rising edge of the signal $C_{>Ref,N,hld}$, with a very signal width of $T_0$ (considerably shorter than $t_a$ or $t_b$ mentioned below) However, this occurs only if the higher threshold level associated with the refined signal $\overline{C}_{>Ref,N+1}$ within $t_a$ time duration is not detected. The $cnt_{\uparrow,N}$ signal effectively rectifies the missing pulses depicted in FIG. 3.

Referring to FIG. 6 again, the $cnt_{\uparrow,N}$ signal is directed into an upper branch of the second stage circuit 442 as the input for the first OR gate 611. The signal subsequently feeds into the INVD circuit 617, which introduces a second delay and inverts the falling edge based on a predetermined time constant $t_b$. The output of the upper INVD circuit 617, represented as an inverted block signal $\overline{blk}_{\downarrow,N}$, captures either the rising edge of $cnt_{\uparrow,N}$ signal or the falling edge signal $X_{Ref\downarrow,N+1}$ via an AND gate, maintaining the inverted output for the predetermined duration $t_b$.

The purpose of the inverted block signal $\overline{blk}_{\downarrow,N}$ is to selectively ignore the detection of the falling edge signal $X_{Ref\downarrow,N}$ via an OR gate 112. In other words, if either $cnt_{\uparrow,N}$ or $X_{Ref\downarrow,N+1}$ occurs, the $X_{Ref\downarrow,N}$ signal will not be considered within the time frame of $t_b$. This time constant $t_b$ defines the minimum separation between two consecutive events, distinguishing them as distinct occurrences and mitigating the count error scenario depicted in FIG. 3.

Several cases are illustrated on how the pulse filter processes two adjacent comparator outputs corresponding to a lower threshold level N (Ref,N) and a next higher threshold level N+1 (Ref,N+1) based on different voltage pulses $V_{TIA}$ coming to the system. In case 1, a short pulse rises above threshold level Ref,N and drops without crossing the next higher threshold level Ref,N+1. A brief $\overline{C}_{>Ref,N}$ (inverse) pulse that is produced and held to be shorter than a predetermined duration $t_a$ by $C_{>Ref,N,hld}$ which does not go high. No higher-level threshold (Ref,N+1) is triggered. $cnt_{\uparrow,N}$ still has a count increment simply due to the crossing of the threshold Ref,N.

In case 2, a nominal pulse crosses just threshold level Ref,N but not Ref,N+1. $\overline{C}_{>Ref,N}$ pulse inversely goes high and stays high long enough to last for $t_a$ to validate an event signal. $X_{Ref\downarrow,N}$ pulses high as $\overline{C}_{>Ref,N}$ pulse inversely goes high signaling a detection of the crossing. $C_{>Ref,N,hld}$ goes high after the delay period $t_a$ to trigger $cnt_{\uparrow,N}$ to high, indicating one count has been registered at level N. But no crossing at the next higher threshold level means no count at level N+1. This signal is sustained but the falling edge occurs within the second time constant $t_b$. resulting in just a single count at level N.

In case 3, a long pulse rises well above threshold level Ref,N and remains high for an extended period. This case represents two events happening in close time proximity (e.g., <50 ns). $X_{Ref\downarrow,N}$ pulses high at the end of the event as $\overline{C}_{>Ref,N}$ goes inversely high signaling a detection of the crossing. $C_{>Ref,N,hld}$ stays low until after the first time constant $t_a$ to trigger $cnt_{\uparrow,N}$ pulses high, indicating a first count has been registered. But $X_{Ref\downarrow,N+1}$ does not occur, and the falling edge signal $X_{Ref\downarrow,N}$ occurs beyond the second time constant $t_b$, which starts ticking after the rising edge of $C_{>Ref,N,hld}$. The inverted block signal $\overline{blk}_{\downarrow,N}$ will capture the rising edge of $cnt_{\uparrow,N}$ and not ignore the detection of the falling edge signal $X_{Ref\downarrow,N}$, triggering a multi-event count. A second count increment will be registered at the Ref,N level based on the falling edge. s. This is a case that shows the subject technology corrects the count error scenario depicted in FIG. 3. Additionally, for this case if the falling edge signal $X_{Ref\downarrow,N}$ occurs beyond n times of the second time constant $t_b$, the event count at level N will be n.

In case 4, the signal pulse initially rises slowly but stays above threshold level Ref,N long enough to be recognized. The same pulse also crosses the threshold level Ref,N+1. But the timespan between the two crossings in ascending direction is shorter than the first delay $t_a$. $X_{Ref\downarrow,N+1}$ pulses high initially, signaling detection of the crossing of a valid event to trigger a count at level N+1 (not shown in FIG. 5). But $cnt_{\uparrow,N}$ remains low because $C_{>Ref,N,hld}$ stays low as $\overline{C}_{>Ref,N+1}$ inversely goes high after $\overline{C}_{>Ref,N}$ inversely goes high to not trigger a counting action at level N. Also as $X_{Ref\downarrow,N+1}$ occurs, the inverted block signal $\overline{blk}_{\downarrow,N}$ is to selectively ignore the detection of the falling edge signal $X_{Ref\downarrow,N}$ within the time frame of $t_b$. $\overline{blk}_{\downarrow,N}$ blocks the count at level N.

In case 5, the signal pulse rises normally but then slowly decays, staying above the threshold level Ref,N for an extended time. $\overline{C}_{>Ref,N}$ remains inversely high for the extended time over one but not two of the second time constant $t_b$. Signal also crosses threshold level Ref,N+1, which triggers a count at level N+1, with $\overline{C}_{>Ref,N+1}$ remains inversely high starting at a time shorter than $t_a$ and stays for a shorter period than $\overline{C}_{>Ref,N}$. $X_{Ref\downarrow,N+1}$ pulses high, indicating the detection of one falling edge at level N+1. But, $X_{Ref\downarrow,N}$ is detected after a prolonged time beyond $t_a$. $C_{>Ref,N,hld}$ stays low as $\overline{C}_{>Ref,N+1}$ inversely goes high after $\overline{C}_{>Ref,N}$ inversely goes high. $C_{>Ref,N,hld}$ pulses high until $t_a$ after $\overline{C}_{>Ref,N+1}$ turns back to the inactive state. $\overline{blk}_{\downarrow,N}$ will not block this count at level N due to the $X_{Ref\downarrow,N}$ beyond the time frame of $t_b$ will not be ignored. Thus, there is one count at level N+1 (not shown in FIG. 5) due to rising edge crossing and another count at level N due to falling edge crossing beyond $t_a$ after the falling edge of $\overline{C}_{>Ref,N+1}$. This is a case that shows the subject technology corrects the missing count scenario depicted in FIG. 3.

In case 6, this is like case 5, except that the signal decays with an even longer extended time. $C_{>Ref,N,hld}$ pulses high and stays high over $t_b$ so that $\overline{blk}_{\downarrow,N}$ will not block this count at level N. Since the time constant $t_b$ defines the minimum separation between two consecutive events, suggesting two counts in level N. Additionally, another count is added at level N+1 due to the detection of valid $X_{Ref\downarrow,N+1}$ pulse. This is a kind of case that shows the subject technology enables the identification of consecutive events close in time, such as those of a higher amplitude event followed by two similar lower amplitudes, triggering the corresponding counters accordingly.

In case 7, this is also like case 5 except that a lower amplitude pulse is followed in close time by a higher amplitude pulse. A rising edge of the pulse crosses the threshold level Ref,N while no rising edge crosses the threshold level Ref,N+1 until a timespan>$t_a$, leading to counters in both levels N and N+1.

Figure 7:
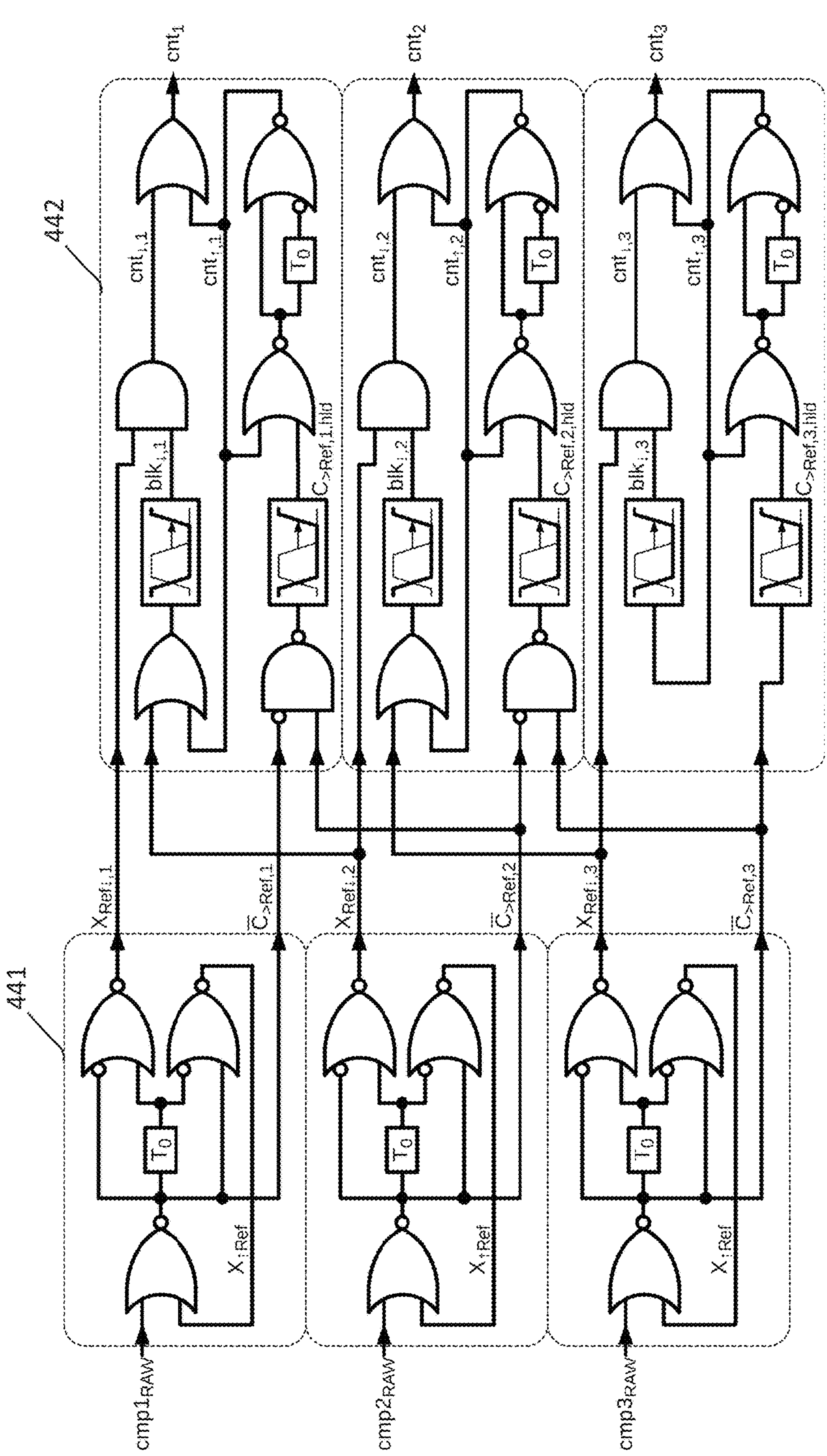
FIG. 7 is a circuit diagram of the pulse filter with cross-coupled two stages operating at three threshold levels according to an embodiment of the subject technology.

FIG. 7 is a circuit diagram of the pulse filter with cross-coupled two stages operating at three threshold levels according to an embodiment of the subject technology. This diagram is merely an example and should not unduly limit the scope of the claims. One of ordinary skill in the art would recognize many variations, alternatives, and modifications. This diagram shows a detailed architecture of a three-comparator pulse filter system, which is a part of a more extensive pulse processing or signal conditioning system in digital electronics including the photon counting for CT scan machines. This setup is particularly suited for applications requiring precise event timing and discrimination based on different threshold levels. Each comparator in the system is responsible for handling signals that exceed specific voltage thresholds, and this detailed processing helps in various applications such as signal decoding, noise reduction, or event counting in a digital system.

Circuit 441 is just the same first stage circuit given in FIG. 5 of the pulse filter 440 in FIG. 4 to provide initial signal processing on the corresponding three comparator outputs, $cmp_{1RAW}$, $cmp_{2RAW}$, and $cmp_{3RAW}$. Each comparator is connected to a delay block (To), which ensures that only signals exceeding a certain duration influence the output, thereby filtering out noise. $X_{Ref\uparrow.i}$ (i=1, 2, 3) represents rising-edge signals generated by edge detection circuits following each comparator. They detect the rising edges of the signals that exceed the thresholds set by the comparators. $X_{Ref\downarrow.i}$ (i=1, 2, 3) represents falling-edge signals that detect the falling edges, helping to define the precise duration of the signal pulse above the threshold. $\overline{C}_{>Ref.i}$ (i=1, 2, 3) signals are outputs from the edge detectors that go through a hold circuit that extends their duration based on the $T_0$ delay. This holding action ensures that the signal is sustained long enough to be considered valid, eliminating the problem of signal drop-outs or glitches affecting the system's accuracy.

Circuit 442 is just the same second-stage circuit given in FIG. 6 of the pulse filter 440 of FIG. 4 to provide signal refinement and generate trigger signals for counting. It includes an inverting delay and blocking sub-circuit. Each comparator output from circuit 441 feeds into a corresponding blocking sub-circuit, which includes an inverting delay (INVD) function. These circuits block erroneous or unwanted signals by maintaining an output only when a consistent and valid signal is detected over the intended duration. $blk_{\downarrow,i}$ signals perform the function of allowing or blocking the count increment based on the conditions detected by the inverting delay. Following the blocking sub-circuits, each signal path is configured to generate trigger signals $cnt_i$ (i=1, 2, 3) for counting that increments a count whenever a valid, non-blocked signal is detected. These counters are crucial for tallying events or pulses that meet the criteria set by the pulse filter (see FIGS. 4, 5, and 6). Through the three threshold level cascaded configuration, the output of each counter potentially feeds back into earlier stages or to other systems for further processing or for providing feedback control, which is not explicitly shown but can be part of more extensive system integration.

Figure 8:
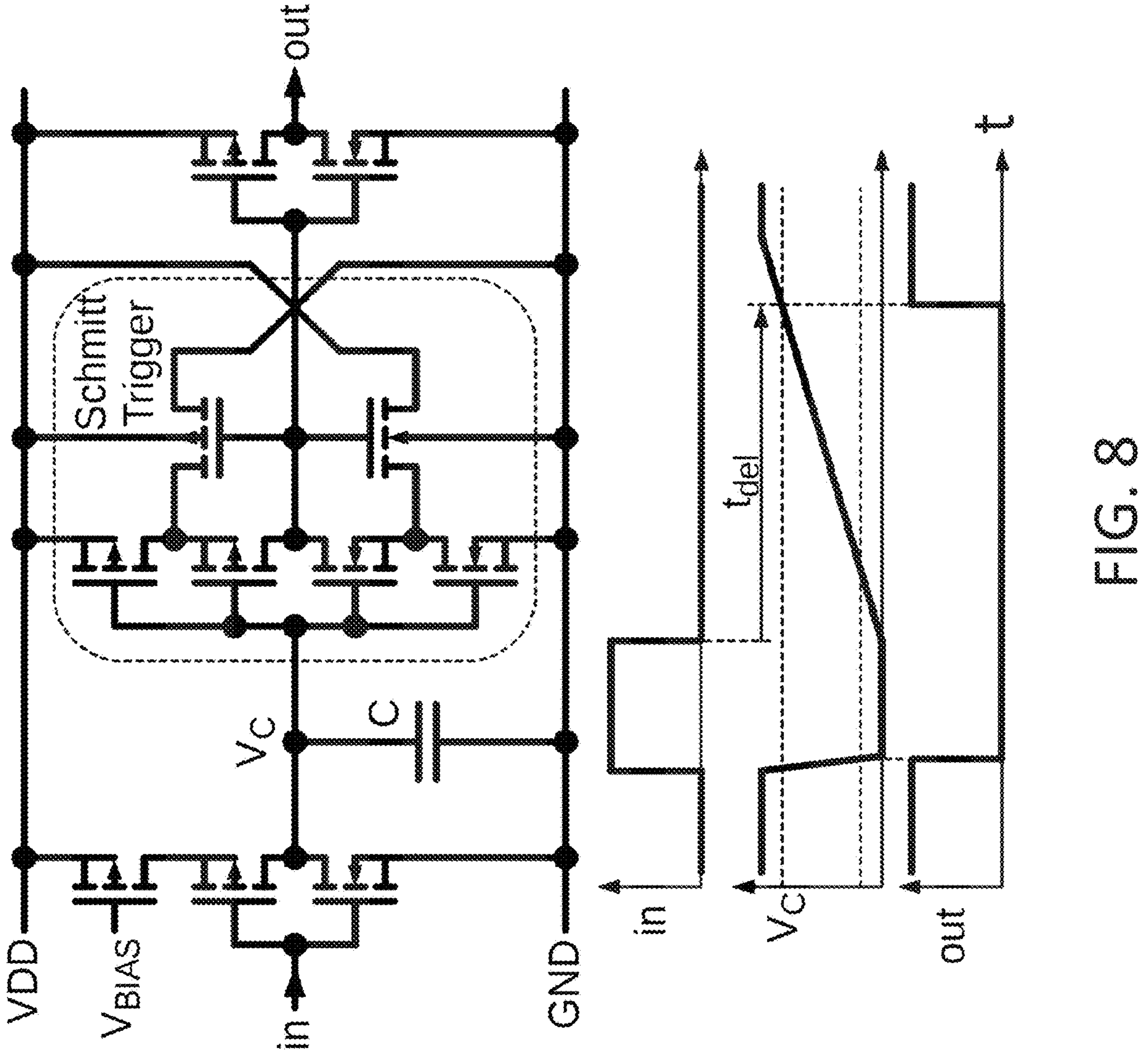
FIG. 8 is a circuit diagram of a digital inverter inside the pulse filter and a corresponding signal timing diagram according to an embodiment of the subject technology.

FIG. 8 is a circuit diagram of a digital inverter inside the pulse filter and a corresponding signal timing diagram according to an embodiment of the subject technology. This diagram is merely an example and should not unduly limit the scope of the claims. One of ordinary skill in the art would recognize many variations, alternatives, and modifications. This diagram illustrates an exemplary sub-circuit designed to perform the function of an inverting delay in a pulse filter application. The circuit includes a current source that is regulated by a bias voltage, $V_{BIAS}$. This voltage sets the operating point of the current source, influencing the amount of current that flows through the circuit. The current source's primary role here is to charge the capacitor C at a rate determined by $V_{BIAS}$. Capacitor C is integral to the timing aspect of this circuit. It charges up over time as current flows through it. The voltage across the capacitor, $V_C$, increases linearly over time until it reaches a threshold that triggers the next stage of the circuit. The time taken for this voltage to reach the threshold is critical and is referred to as the delay time ($t_{del}$). The Schmitt Trigger in this circuit acts as a comparator with hysteresis. It has two threshold voltages, an upper and a lower, which helps in providing a stable digital output even if the input signal is noisy or has minor fluctuations. The Schmitt Trigger monitors the voltage across capacitor C, and once this voltage exceeds its set threshold, it changes the state of the output signal. The output of the Schmitt Trigger is the delayed and inverted version of the input signal. The inversion occurs because the Schmitt Trigger outputs a high signal only when the input (the voltage across capacitor C) crosses the upper threshold, which happens after a delay introduced by the charging time of the capacitor.

Referring to FIG. 8, when an input pulse (signal "in") arrives, it initiates the charging of the capacitor C via the controlled current source. As the capacitor charges, the voltage across it ($V_C$) starts to rise. The rate of rise (slope of the $V_C$ curve) is dependent on the current supplied by the current source and the capacitance value of C. The time delay ($t_{del}$) before the output changes state is directly proportional to the time required for $V_C$ to reach the threshold of the Schmitt Trigger. This time delay can be adjusted by changing $V_{BIAS}$, which alters the charging current, or by modifying the capacitance value of C. Once $V_C$ reaches the upper threshold of the Schmitt Trigger, the output (signal "out") transitions from low to high (or high to low, depending on the initial state and design of the Schmitt Trigger). This output transition is the delayed version of the input pulse, occurring after $t_{del}$. This sub-circuit provides adjustable time parameter $t_{del}$ corresponding to the designated times $t_a$ or $t_b$, the time delays mentioned in FIG. 6. The circuit operates with a current source regulated by the $V_{BIA}$S voltage. The current, under the influence of $V_{BIAS}$, determines the $t_{del}$ time constant in conjunction with the capacitor C.

Figure 9:
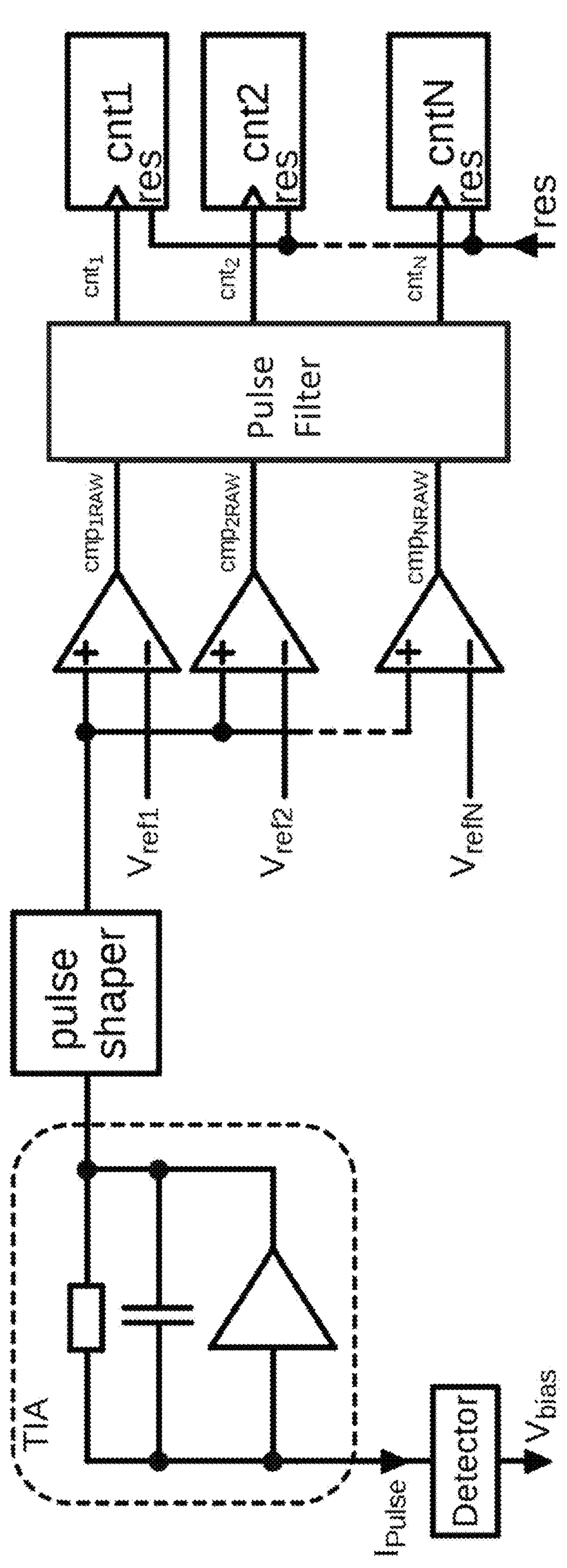
FIG. 9 is a block diagram of a sensing front-end coupled with a pulse shaper in front of digital comparators followed by a pulse filter in front of counters according to an embodiment of the subject technology.

FIG. 9 is a block diagram of a sensing front-end coupled with a pulse shaper in front of digital comparators followed by a pulse filter in front of counters according to an embodiment of the subject technology. This diagram is merely an example and should not unduly limit the scope of the claims. One of ordinary skill in the art would recognize many variations, alternatives, and modifications. In some embodiments for certain applications, the TIA output can be enhanced by integrating a pulse-shaping circuitry, which has a specific transfer function designed to improve signal information extraction and/or suppress the baseline, as illustrated in FIG. 9. This integration does not negate the benefits of using a pulse filter—it requires that the time constants of the pulse filter be finely tuned to match the response times of the pulse shaping circuitry for optimal performance.

While the above is a full description of the specific embodiments, various modifications, alternative constructions, and equivalents may be used. Therefore, the above description and illustrations should not be taken as limiting the scope of the present invention which is defined by the appended claims.

What is claimed is:

1. A system for enhancing digital signal event counting comprising:

- a front-end amplifier configured to convert current/charge signals collected by a photon detector to voltage signals;
- a plurality of comparators, each being associated with a threshold level, coupled to the front-end amplifier to compare the voltage signals against each threshold level to generate the plurality of comparator outputs at corresponding threshold levels for each voltage signal;
- a pulse filter coupled to the plurality of comparators and configured to generate a refined signal associated with a rising edge and a falling edge of each comparator output, identify timing characterization of at least two refined signals respectively corresponding to a lower threshold level and a next higher threshold level, and generate a trigger signal corresponding to an event counting based on the timing characterization associated with both the rising edge and the falling edge; and
- a plurality of counters coupled to the pulse filter and configured to increment a count at the lower threshold level or both the lower threshold level and the next higher threshold level for each event counting based on the trigger signal;
- wherein the pulse filter comprises a plurality of filter units, wherein each filter comprises a first-stage circuit coupled with a second stage circuit; the second stage circuit comprising a first-branch inverting delay sub-circuit to introduce a first delay to the falling edge of one of two refined signals corresponding to either the lower threshold level or the next higher threshold level to generate a hold signal for discriminating the refined signal corresponding to the lower threshold level with a duration shorter than the first delay if no refined signal corresponding to the higher threshold level is detected within the first delay.

2. The system of claim 1, wherein the plurality of filter units is coupled to the plurality of comparators in a cascaded configuration with each filter unit receiving the comparator output from one of the plurality of comparators at a corresponding threshold level.

3. The system of claim 2, wherein the pulse filter in the cascaded configuration is configured to generate a trigger signal at a highest threshold level crossing a voltage signal for the counters corresponding to the threshold level based on a single pulse for each event.

4. The system of claim 2, wherein the first-stage circuit configured to process the comparator output to obtain a refined signal and a rising-edge signal and a falling-edge signal to respectively detect the rising edge and the falling edge for differentiating the refined signal.

5. The system of claim 4, wherein the second-stage circuit is configured to cross-couple with the first stage circuit coupled to a comparator at the lower threshold level and another first stage circuit coupled to a comparator at the next higher threshold level.

6. The system of claim 5, wherein the second-stage circuit further comprises a feedback sub-circuit configured to process the hold signal to generate a trigger signal by differentiating a rising edge of the hold signal corresponding to the lower threshold level.

7. The system of claim 6, wherein the second-stage circuit further comprises a second-branch inverting delay sub-circuit to introduce a second delay to the falling edge of either the trigger signal from the feedback sub-circuit or the refined signal corresponding to the falling edge signal at the next higher threshold level to generate a block signal for a timespan of the second delay.

8. The system of claim 7, wherein the second-stage circuit further is configured to combine the block signal and the falling edge signal at the lower threshold level to discriminate the refined signal corresponding to the lower threshold level with its falling edge within the timespan of the second delay, provided that either the trigger signal from the feedback sub-circuit or the falling edge signal at the next higher threshold level occurs.

9. The system of claim 7, wherein the pulse filter is configured to measure the timespan between crossing the lower threshold level and the next higher threshold level in both ascending and descending directions and generate the trigger signal to cause a multi-event count increment of both counters corresponding to the lower threshold level and the next higher threshold level if the timespan exceeds the first delay.

10. The system of claim 7, wherein the counter corresponding to the lower threshold level is configured to increment its state triggered by the rising edge of the comparator output corresponding to the lower threshold level and the comparator output staying high for a timespan after the rising edge, provided there is no rising edge at the comparator output corresponding to the next higher threshold level within the timespan of the sum of the first delay and the second delay.

11. The system of claim 7, wherein the counter corresponding to the lower threshold level is configured to increment its state on the falling edge of the comparator output corresponding to the lower threshold level if there was no falling edge at the comparator output corresponding to the next higher threshold level and the rising edge of the comparator output corresponding to the lower threshold level occurred beyond a timespan of the sum of the first delay and the second delay.

12. The system of claim 7, wherein the counter corresponding to the lower threshold level is configured to increment its state on the rising edge of the comparator output corresponding to the lower threshold level if a rising edge of the comparator output corresponding to the next higher threshold level occurred beyond a timespan of the first delay starting after the rising edge of the comparator output corresponding to the lower threshold level.

13. The system of claim 7, wherein the counter corresponding to the lower threshold level is configured to increment its state if the comparator output corresponding to the next higher threshold level exhibits a falling edge and no falling edge of the comparator output corresponding to the lower threshold level occurs within a timespan of the first delay after the falling edge of the comparator output corresponding to the next higher threshold level.

14. The system of claim 7, wherein the counter corresponding to the lower threshold level is configured to increment its state at the falling edge of the comparator output corresponding to the lower threshold level if the comparator output stayed high at least for a minimum period defining an event.

15. A system for enhancing digital signal event counting comprising:

- a front-end amplifier configured to convert current/charge signals collected by a photon detector to voltage signals;

a plurality of comparators, each being associated with a threshold level, coupled to the front-end amplifier to compare the voltage signals against each threshold level to generate the plurality of comparator outputs at corresponding threshold levels for each voltage signal;

a pulse filter coupled to the plurality of comparators and configured to generate a refined signal associated with a rising edge and a falling edge of each comparator output, identify timing characterization of at least two refined signals respectively corresponding to a lower threshold level and a next higher threshold level, and generate a trigger signal corresponding to an event counting based on the timing characterization associated with both the rising edge and the falling edge;

wherein the pulse filter comprises a plurality of filter units coupled to the plurality of comparators in a cascaded configuration with each filter unit receiving the comparator output from one of the plurality of comparators at a corresponding threshold level;

wherein each filter unit comprises a first-stage circuit coupled with a second-stage circuit, the first-stage circuit configured to process the comparator output to obtain a refined signal and a rising-edge signal and a falling-edge signal to respectively detect the rising edge and the falling edge for differentiating the refined signal;

wherein the second stage circuit is configured to cross-couple with the first stage circuit coupled to a comparator at the lower threshold level and another first stage circuit coupled to a comparator at the next higher threshold level;

wherein the second stage circuit comprises a first-branch inverting delay sub-circuit to introduce a first delay to the falling edge of one of two refined signals corresponding to either the lower threshold level or the next higher threshold level to generate a hold signal for discriminating the refined signal corresponding to the lower threshold level with a duration shorter than the first delay if no refined signal corresponding to the higher threshold level is detected within the first delay;

and a plurality of counters coupled to the pulse filter and configured to increment a count at the lower threshold level or both the lower threshold level and the next higher threshold level for each event counting based on the trigger signal.

* * * * *